United States Patent [19]

Betz et al.

[11] Patent Number: 5,047,281
[45] Date of Patent: Sep. 10, 1991

[54] FIBER REINFORCED COMPOSITE MATERIAL AND METHOD FOR PRODUCING FIBERS FOR SUCH MATERIAL

[75] Inventors: Wolfgang Betz, Gauting; Werner Huether, Karlsfeld; Herbert Merz, Munich, all of Fed. Rep. of Germany

[73] Assignee: MTU Motoren-und Turbinen-Union Muenchen GmbH, Munich, Fed. Rep. of Germany

[21] Appl. No.: 946,649

[22] Filed: Dec. 24, 1986

Related U.S. Application Data

[63] Continuation of Ser. No. 623,553, Jun. 22, 1984, abandoned.

[30] Foreign Application Priority Data

Jul. 1, 1983 [DE] Fed. Rep. of Germany ....... 3323855

[51] Int. Cl.$^5$ .......................... B32B 3/00; B32B 15/04; B32B 17/06
[52] U.S. Cl. .................................. 428/201; 428/195; 428/198; 428/288; 428/366; 428/367; 428/400; 428/408; 428/426; 428/457; 428/210
[58] Field of Search ............... 428/426, 400, 201, 345, 428/343, 198, 200, 210, 195, 368, 366, 698, 399, 288, 293, 294, 367, 408, 457; 156/291; 501/95

[56] References Cited

U.S. PATENT DOCUMENTS

| 2,668,348 | 2/1954 | Hubbell | 428/198 X |
|---|---|---|---|
| 2,920,981 | 1/1960 | Whitehurst | 523/200 X |
| 3,491,055 | 1/1970 | Talley | 523/200 |
| 3,767,518 | 10/1973 | Beninga et al. | 428/201 |
| 3,993,818 | 11/1976 | Novak | 428/368 X |
| 4,107,372 | 8/1978 | Clausen et al. | 156/291 X |
| 4,132,828 | 1/1979 | Nakamura | 428/366 |
| 4,248,752 | 2/1981 | Myles | 428/698 |
| 4,312,917 | 1/1982 | Hawley | 428/398 X |
| 4,347,287 | 8/1982 | Lewis et al. | 428/399 |
| 4,396,663 | 8/1983 | Mitchell et al. | 156/291 X |
| 4,474,906 | 10/1984 | Nakama et al. | 428/368 X |
| 4,489,129 | 12/1984 | Shue et al. | 428/368 X |

FOREIGN PATENT DOCUMENTS

| 57-183459 | 11/1982 | Japan | 428/198 |
|---|---|---|---|
| 1397955 | 6/1975 | United Kingdom | 428/384 |

OTHER PUBLICATIONS

Mitchell et al., PCT Publication No. WO80/02818, Dec. 24, 1980.

*Primary Examiner*—Lorraine T. Kendell
*Attorney, Agent, or Firm*—W. G. Fasse; D. H. Kane, Jr.

[57] ABSTRACT

A fiber composite material has individual reinforcing fibers embedded in a bonding matrix material. The bonding of the fibers to the embedding matrix material is controlled along the length of the fibers by axially spaced fiber surface bonding zones having a high bonding ability and alternating with further fiber surface low bonding or non-bonding zones having a low or no bonding ability relative to the matrix material. The bonding zones having a high or maximal bonding ability are distributed optimally as to size, location and spacing along the length of a fiber so that loads or forces including the breaking load are transmitted from one bonding zone to the next bonding zone which are preferably formed as ring zones. The low-bonding or non-bonding zones are so dimensioned that bonding zones of fibers located adjacent to one another do not overlap in a direction across the length of the fibers. The bonding and low-bonding or non-bonding zones are applied along the length of a fiber in a continuous manner, whereby different application methods may be used.

19 Claims, 3 Drawing Sheets

FIBER REINFORCED COMPOSITE MATERIAL AND METHOD FOR PRODUCING FIBERS FOR SUCH MATERIAL

This application is a continuation, of application Ser. No.: 623.553, filed June 22, 1984, and now abandoned.

FIELD OF THE INVENTION

The invention relates to a fiber composite material in which reinforcing fibers such as carbon fibers, glass fibers, ceramic fibers or metal fibers, synthetic fibers are embedded in a suitable matrix material, such as metal, ceramic, glasses or glass ceramics or/a resinous matrix material. The invention also relates to a method for producing or preparing reinforcing fibers suitable for use in such fiber composite materials.

BACKGROUND OF THE INVENTION

Fiber reinforced materials are relatively brittle compared to metallic materials. The more brittle the fibers are, the brittler will be the fiber composite material. Similarly the fiber composite material will also be rather brittle if the matrix material and the fiber is brittle and/or if the bonding surface between brittle fiber and the matrix is too well adhering.

On the other hand, only relatively brittle fibers and relatively brittle matrix materials are usable in the range of high temperatures and very high temperatures, namely, in the range from 250° C. to 1400° C. depending on the combination of materials. Further, it is absolutely necessary that a high strength adhesion is assured at the interface between the fiber surface and the matrix material because without such high strength bonding it would not be possible to transmit the necessary shearing loads between the load carrying fibers and the load transmitting matrix material. As an extreme illustration, without such high strength bonding the fibers could be pulled out of the matrix material. However, this desirable high adhesion has the disadvantage that a crack in the brittle matrix material extending substantially perpendicularly to the longitudinal extension of the fiber, causes a high locally concentrated notch strain loading in the fiber. As a result, the fiber breaks without being able to transfer the strain around the crack tip and by this to develop a so called crack stopper effect.

OBJECTS OF THE INVENTION

In view of the above it is the aim of the invention to achieve the following objects singly or in combination:

to provide a fiber-reinforced composite material in which such notch load concentrations in the fiber are avoided or at least reduced;

to provide a fiber which has along its length a controlled or varying bonding ability relative to an embedding material;

to provide a method for producing a fiber having along its length, zones of different bonding abilities or differing adhesivenesses;

to make sure that the interface bonding between the fiber and the embedding matrix material is sufficiently high to fully utilize the load carrying strength of the fiber on the one hand while simultaneously providing a crack stopping effect along the length of the fiber for preventing the above mentioned notch concentration loads; and to provide ring zones of high bonding ability and of low or no bonding ability which alternate with each other along the length of a fiber for achieving the crack stopper effect.

SUMMARY OF THE INVENTION

According to the invention, each of the fibers in a fiber-reinfored composite material, is provided with surface zones having a high bonding ability which alternate in the axial direction along the fiber with other surface zones having a small bonding ability or no bonding ability at all relative to the matrix material in which the fibers are embedded. It is preferable that the first and second zones of differing bonding ability along the length of a fiber have a ring shape. The zones having a high adhesion are preferably arranged in such a way that the bonding strength between the fiber and the embedding material in said zone is capable of transmitting the ultimate breaking strength of the fiber in the respective matrix. An optimal arrangement of the zones having a high bonding ability will be ascertained by experiment and such experiment will involve the surface area size of the individual zones as well as their spacing and their arrangement relative to each other from one fiber to adjacent fibers. Thus, the zones having the high or maximal bonding ability will be able to transmit the breaking strength of a fiber from one bonding ring or zone to the next.

On the other hand, the second zones of minimal bonding ability at the interface to the embedding matrix are so dimensioned with regard to their length along the fiber that it becomes statistically improbable that the first bonding zones of adjacent fibers will be located next to each other or in parallel to each other. In other words, the bonding zones of adjacent fibers should be arranged in a staggering relationship and not in an overlapping relationship.

Fibers suitable for the present purposes are manufactured or prepared according to the invention by passing the fibers spread individually through a treatment station in which the fibers are first treated to achieve a fiber surface having an active bonding ability whereupon the so-prepared fiber surface is selectively treated along its length with a substance or substances which reduce the initial bonding ability or even eliminates such initial bonding ability in predetermined zones, preferably ring zones along the length of the fiber. The zones of reduced or no bonding ability at all are preferably produced by applying a separation substance to the fiber surface at spaced intervals with the aid of oppositely rotating tool members such as wetting rollers or stamping members. Alternatively a fiber surface having an inactive bonding can be made active by applying thereon in predetermined zones a substance or layer, enhancing its bonding ability.

However, the invention is not limited to this type of application of the zones of different bonding ability. Such zones may also be produced by applying the treating substance through a filter mask, preferably in the form of one or several endless belts having respectively spaced apertures in these belts for the deposition of the treating substance from a gas or vapor phase or even in the form of a plasma deposition. For example, it is possible to apply through the filter or screen mask a barrier or adhesion layer respectively onto the fiber surface. Where the filter or screen mask is used in the form of an endless belt, the rotational speed of the belt or belts correspond to the passing speed of the fiber. If, for example, the fibers are made of silicon carbide, the separation substance may be a layer of graphite.

Another way of providing zones of different bonding ability along the length of each fiber involves first applying to the fiber surface a non-adhering substance which reduces the bonding ability partially or completely. Zones of an active bonding ability are now produced at those places where the non-adhering substance is being removed. This may be accomplished by passing the fiber through a gap formed between rotating wetting rollers or stamps which transmit a reaction substance onto the surface of the reducing substance by way of a surface contact. The reaction substance must be suitable to destroy the reducing substance or to convert the reducing substance into a bonding layer having a determined adhesiveness.

The removal of the reducing substance may also be accomplished by applying thermal energy. Thermal energy may be applied in the form of flame bursts at timed intervals as the fiber passes through the treatment station. A laser beam is also suitable for this purpose.

The removal of the reducing or separation substance at spaced intervals may also be accomplished by a destructive or abrading blasting or by applying a radiation for this purpose such as ultraviolet radiation or electron radiation or corpuscular radiation. For example, in connection with a silicon carbide fiber coated with a graphite separation or bonding reducing layer, the latter may be removed in predetermined zones by burning off the graphite layer in such zones.

Preferably, the fiber treatment according to the invention is performed at the end of the fiber production proper. However, it is also possible to integrate the present treatments into the fiber production process, or to perform such treatment at any time subsequent to the actual fiber production.

The type of treatment needed for providing an active bonding ability and for providing a reduced bonding ability or no bonding ability at all in different surface zones along the length of a fiber will depend on the respective fiber matrix material combination. It is important to pay attention to the requirement that the bonding ability reducing layer must not react with the fiber material, nor with the matrix material. Further, the reducing or separation substance or layer must provide a friction coefficient as low as possible. However, with regard to the primary coating, which is to provide an active or inactive bonding on the surface of a fiber, it may very well be desirable to provide a controlled reaction between the fiber material and a reacting substance, for example, for the purpose of assuring a better wetting of the fiber surface.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
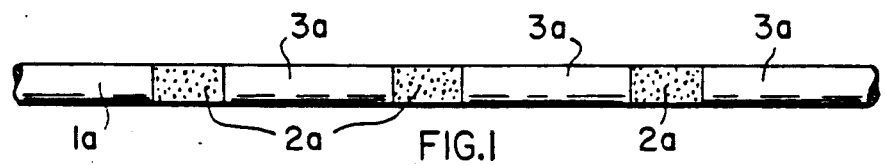
FIG. 1 shows a single fiber treated according to the invention so that it has zones of high and low bonding ability alternating with each other along the length of the fiber.

FIG. 1 shows a fiber prepared according to the invention for use in a fiber composite material as a reinforcing fiber. A plurality of such fibers 1a will be embedded, normally in a mutually parallel orientation, in a matrix material. The fibers may, for example, be made of the following materials: Boron, Carbon metal, glass, ceramic, The matrix materials may, for example, be selected from the group comprising metal, glass, glass ceramics, ceramic, resinous or other plastic materials known per se.

Each individual fiber 1a comprises in alternate succession in the axial direction first zones 2a having a large or maximal bonding ability or adhesiveness relative to the embedding matrix material. Second zones 3a are interspersed between the zones 2a. The second zones 3a have a lower adhesiveness or bonding ability or no bonding ability relative to the embedding material.

Figure 2:
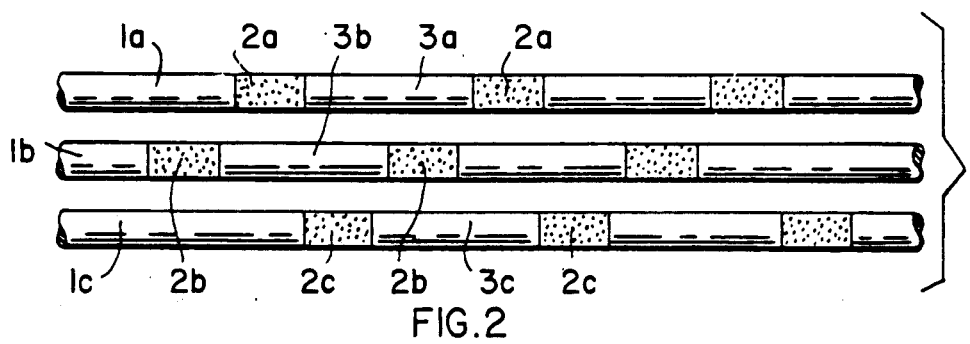
FIG. 2 is a view similar to that of FIG. 1, however, showing three fibers arranged alongside each other to illustrate the staggering of the alternating zones from fiber to fiber.

FIG. 2 shows a group of three individual fibers 1a, 1b, and 1c. Each fiber has respective high bonding zones 2a, 2b and 2c as well as low bonding zones 3a, 3b and 3c. The high bonding zones 2a, 2b and 2c are so arranged, especially dimensioned and spaced from one another that the breaking strength of the individual fibers is transmitted from one high bonding zone to the next adjacent high bonding zone. Preferably, the high bonding zone as well as the low bonding or no bonding zones are provided as ring zones reaching entirely around each respective fiber.

The low bonding or no bonding zones 3a, 3b, and 3c have such an axial length that it becomes statistically improbable that high bonding zones 2a, 2b, 2c are overlapping one another in a direction extending substantially perpendicularly to the length of the fibers. In other words, these high bonding zones are staggered relative to each other from fiber to fiber in a group of fibers as shown in FIG. 2. It has been found that this staggering of the high bonding zones still assures the desired reinforcing of the fiber reinforced composite material by fully utilizing the fiber strength while simultaneously permitting the also desired crack stop characteristic or effect in the zones 3a, 3b, 3c of lower interface bonding between the fibers and the embedding matrix material. Thus, a crack extending in the matrix material substantially perpendicularly to the longitudinal axis of the fibers is prevented from causing a high local so-called notch impact concentration. It has been found, that in this manner it is possible to substantially increase the impact resistance of the fiber reinforced composite material comprising relatively brittle fibers embedded in a relatively brittle matrix material.

The fibers shown in FIGS. 1 and 2 for use in a fiber reinforced composite material according to the invention may be prepared in several ways. Preferably, in a first step the entire fiber surface is treated to provide a primary adhesively active or inactive coating with a predetermined bonding ability or inability. The term "coating" in this context includes an individual layer of an adhesiveness or non-adhesiveness determining substance as well as a fiber surface treated so as to have a predetermined bonding ability or adhesiveness or an inability to bond to the matrix material.

Figure 3:
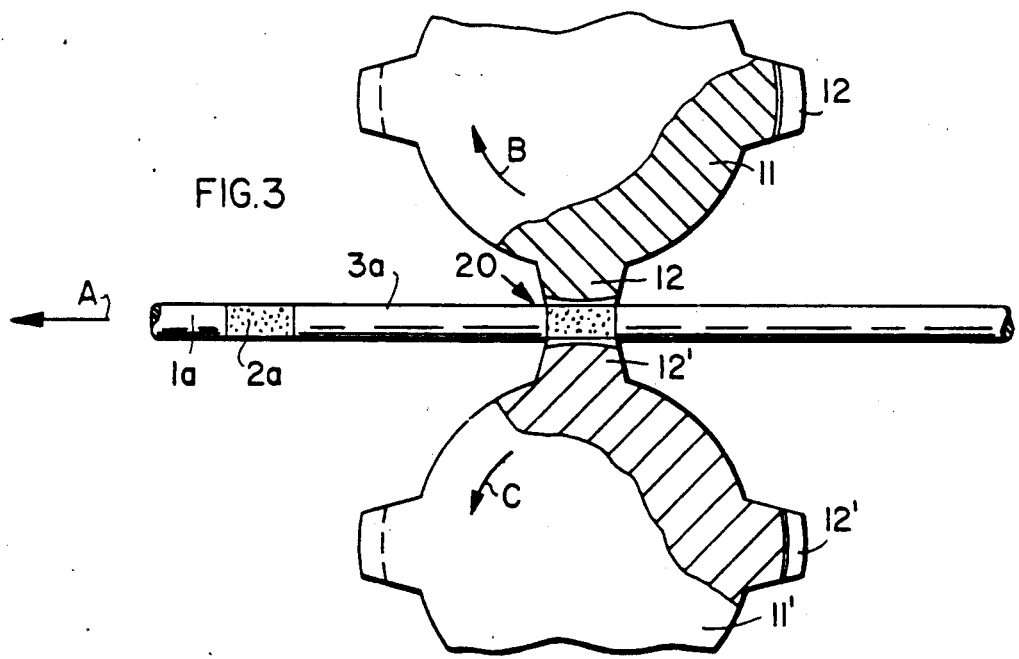
FIG. 3 illustrates a schematic side view of a treatment station with two rotating tool members for applying actively bonding ring zones to the fiber surface at spaced intervals.

FIG. 3 shows two tool members 11 and 11' in the form of rollers having on their surface fiber contacting radially projecting elements 12, 12' which are so angularly spaced relative to each other around the respective roller that the length of the low bonding or no bonding zones 3a, 3b, 3c as determined by the spacing between these elements 12, 12' while the length of the high bonding zones 2a, 2b, 2c is determined by the circumferential width of these elements 12, 12'. Preferably, the elements 12, 12' have a concave cross-sectional configuration in a plane extending perpendicularly to the plane of the drawing so that two cooperating elements 12, 12' form a gap 20 which substantially encircles a fiber completely when the fiber is passing through the gap 20.

Both rollers 11, 11' are rotated in opposite directions so that two elements 12, 12' at the moment of cooperation in the gap formation move substantially tangentially relative to a fiber 3a which is advanced in the direction of the arrow A in FIG. 3. The upper roller 11 rotates clockwise as indicated by the arrow B while the lower roller 11' rotates counterclockwise as indicated by the arrow C. The feed advance or speed of the fiber and the rotational speed of the rollers 11, 11' are synchronized to each other so as to provide the desired length for the low bonding or no bonding zones 3a.

Prior to passing a fiber through the gap 20 the entire fiber has been treated so as to provide its surface entirely with a primary adhesive coating which may have a very low bonding ability or even no bonding ability. The elements 12, 12' are wetted with an etchant so that the initial low bonding coating or surface of the fiber is at least partially destroyed in such a manner that the high bonding zones 2a are formed. The etchant may be supplied to the elements 12 of the upper roller, for example, by dripping action, while the etchant may be applied to the elements 12' of the lower roller 11' by passing the elements 12' through a trough containing the etchant. The elements 12 and 12' are inert to the etchant. Due to the projection of the elements 12, 12' the etching operation does not affect the low bonding or no bonding zones 3a.

Figure 4:
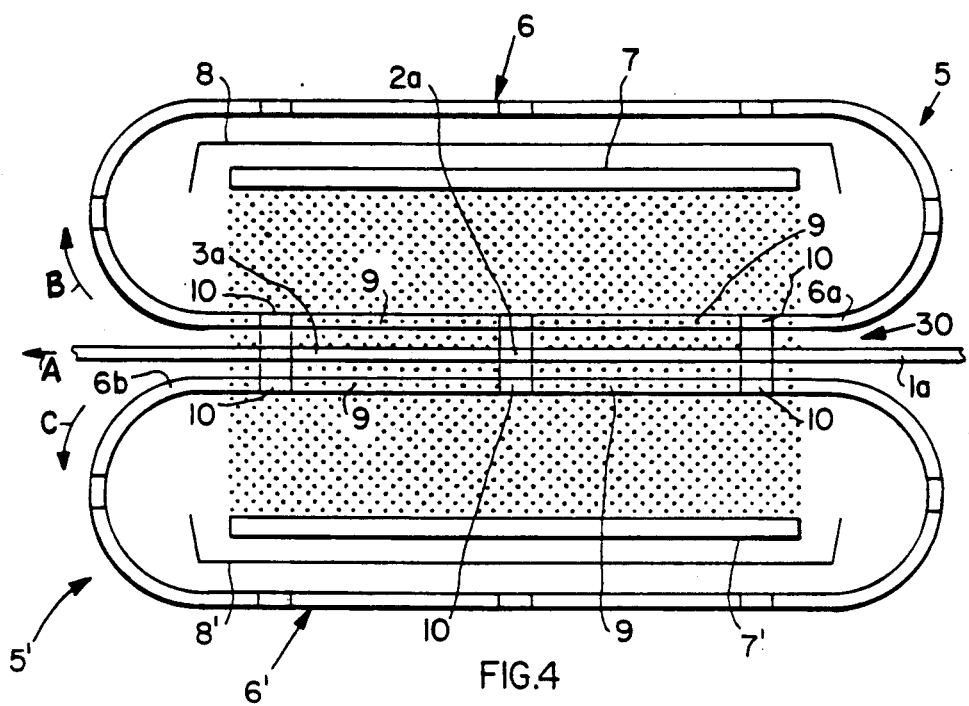
FIG. 4 illustrates schematically a treatment station for applying surface activated zones to a fiber with the aid of rotating endless belt masks.

FIG. 4 illustrates another possibility of treating reinforcing fibers for the present purposes. A fiber initially coated with a primary adhesive coating of a high bonding ability or adhesiveness passes through a gap 30 formed by two filter masks 5 and 5'. Each of these filter masks 5, 5' comprises an endless belt 6, 6' and these belts are rotated in opposite directions, whereby again the upper belt 6 rotates clockwise as indicated by the arrow B while the lower belt 6' moves counterclockwise as indicated by the arrow C while the fiber 1a moves again in the direction of the arrow A. More specifically, the gap 30 is defined between the lower run 6a of the belt 6 and the upper run 6b of the lower belt 6'. The belts 6, 6' are driven with the same speed as the speed of the fiber advance so that the lower run 6a and the upper run 6b move in synchronism with the fiber 1a. Thus, this synchronism between the just mentioned speeds makes it possible to treat the fibers in a continuous manner. Both tapes 6, 6' are provided with crosswise extending lands 10 and with longitudinal holes 9 between the lands 10. A gaseous or vaporous or plasma substance indicated by the dots in FIG. 4 is capable to pass through the holes 9, but not through the lands 10. Thus, these lands 10 have a masking effect to make sure that the high bonding zones 2a are formed on the fiber surface at spaced intervals in which the second zones 3a of low or no bonding ability are formed due to the deposition of an adhesiveness reducing or preventing substance through the holes 9. This adhesiveness reducing or preventing substance is provided by vaporizers 7, 7' shielded by shields 8, 8'. After the fiber has passed through the gap 30, the first high bonding zones 2a retain their high adhesiveness while the zones 3a have a low or no bonding ability as described.

Figure 5:
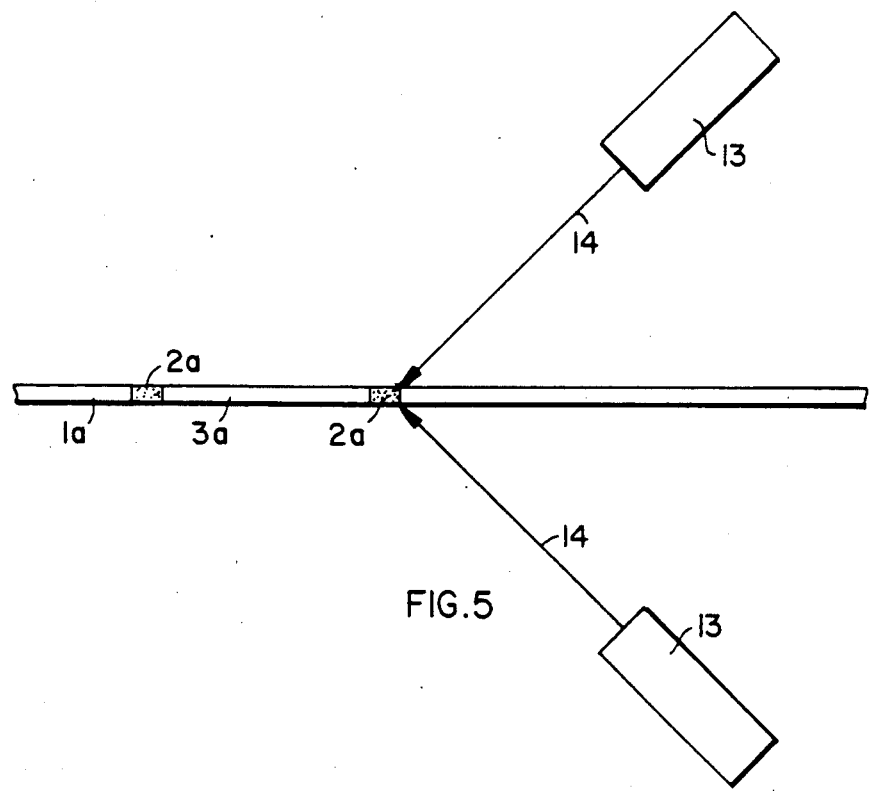
FIG. 5 illustrates schematically a treatment station using two radiation sources.
Figure 6:
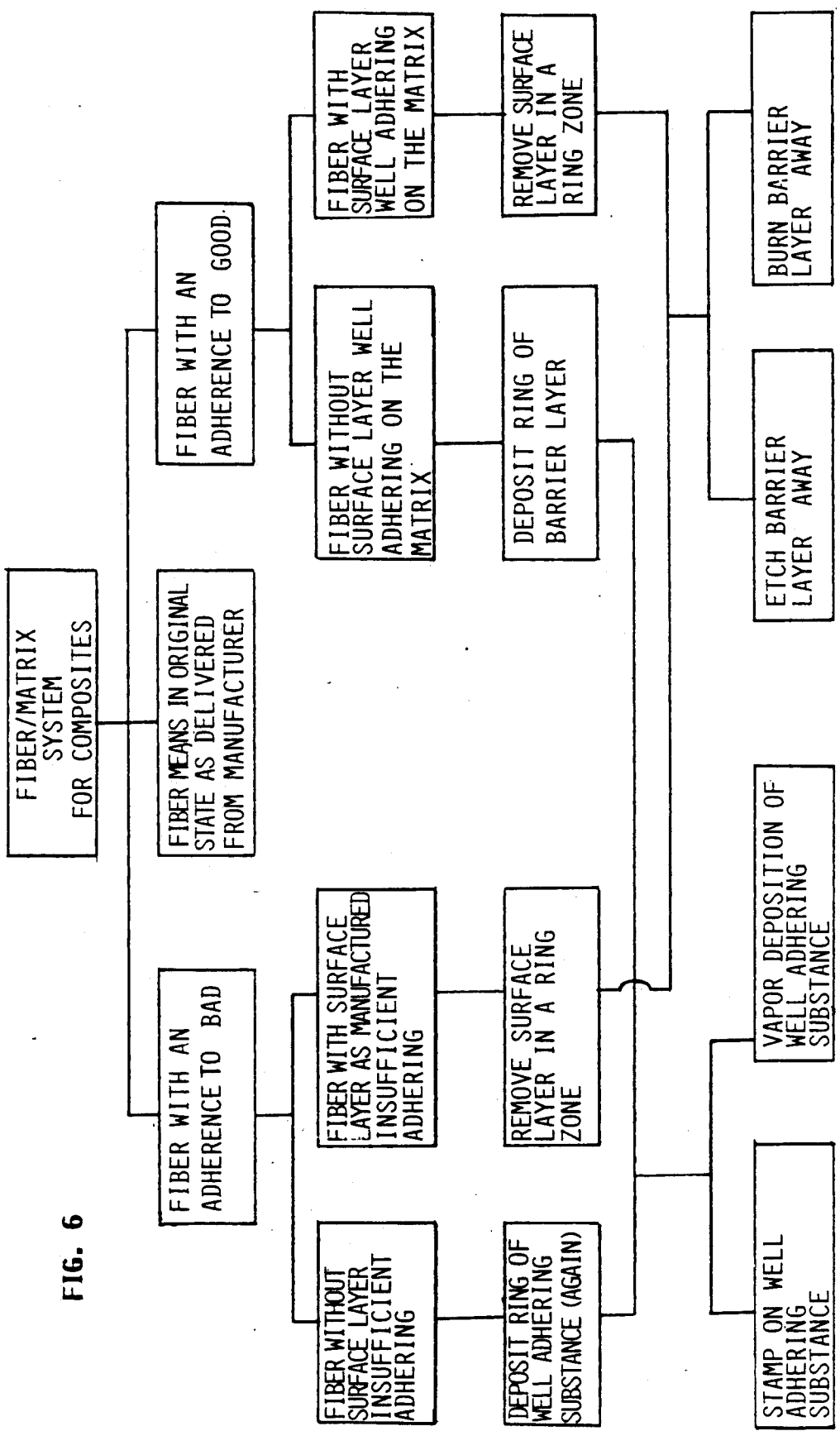
FIG. 6 illustrates the different possible ways of fiber treatment according to the invention.

FIG. 5 illustrates yet another apparatus for treating the fibers 1a which are initially covered completely with a primary coating, which, as mentioned, may have a very low or no adhesiveness at all. Two lasers 13 are located relative to the feed advance direction of the fiber 1a in such positions that the laser beam pulses 14 hit the fiber at predetermined intervals to again form the high bonding zones 2a spaced by the low bonding zones 3a. The laser beam pulses 14 are timed relative to said feed advance speed of the fiber so that the desired length of the low bonding zones 3a is achieved. It has been found that the thermal energy of the laser beams which simultaneously hit the fiber on opposite sides are able to remove or thermally destroy the primary coating to provide the high bonding zones 2a.

For better understanding of the invention the following examples are given:

EXAMPLE 1

Boron fibers to be embedded in an aluminum matrix as delivered from a fiber manufacturer normally have a good bonding ability with respect to aluminum or similar metals. These fibers are partially coated, especially in ring zones spaced along its length with a barrier layer of $Al_2O_3$ by a vapor deposition method in a mask technique. Vapor deposition method means physical vapor deposition (PVD) or chemical vapor deposition (CVD) preferably in a vacuum or a reactive atmosphere by plasma or ion sputtering.

Other chemical methods, such as screen printing of parts are also applicable for selectively coating the fiber.

EXAMPLE 2

Carbon fibers to be embedded in a resinous matrix such as a polyimide, as delivered from a fiber manufacturer are normally surface-treated and/or sized so that these fibers are well adhering to the resinous matrix.

According to one method of the invention the treated/sized surface is selectively destroyed or/post-treated, especially in spaced zones along its length, so that-between well adhering ring zones-are then located zones having low or no adherence to the resinous matrix, depending on the degree of treatment p.e. by means of radiation, thermal, chemical, or electrical methods. Radiation from a source such as a laser source has the advantage of simple limitation in area and degree of treatment. Ion etching or a chemical etchant is advantageous in cases where broader zones should be made inactive.

EXAMPLE 3

Carbon fibers to be embedded in a resinous matrix as in Example 2. After delivery they are selectively, in spaced ring zones along their length, coated with a silicone parting agent as a barrier layer deposited by any suitable method.

EXAMPLE 4

Graphite fibers, with untreated surface to be embedded in a resinous matrix, where it adheres badly, are partially treated and/or sized in surface zones, where it should have a good adherence to the matrix material. Treating or sizing could be done in selected surface areas i.e. by thermal treatment such as oxidation or a chemical treatment such as applying a bonding agent or bonding layer.

EXAMPLE 5

Fibers of SiC containing $SiO_2$ sold under trade name "Nicalon", to be embedded in a borosilicate glass are coated with graphite selectively as a.m.. i.e. from a phenolic resin by thermal dissociation.

EXAMPLE 6

Fibers of SiC as in Example 5 to be totally coated with a CVD-graphite coating are selectively treated i.e. by laser beams in an oxidative atmosphere or by an etchant such as perchloric acid.

The invention is not limited to the examples given in the description because, depending on the purpose of the composite material many different combinations of fibers/matrix and treating methods can be chosen.

The term "treating" in the sense of the invention includes any surface treatment known per se, which is suitable to make the fiber surface good adherent or bad adherent to the respective matrix.

In this connection the following steps can be taken for practicing the invention. On a fiber which in its primary original surface condition by nature does not or does not sufficiently adhere to the matrix material, well adhering zones dimensioned and spaced as above described are created by application of adhering substances within said zones. On a fiber which by nature in its original surface condition would well adhere to the matrix material but is contaminated with a primary surface layer of bad or non-adhering substances, well adhering zones dimensioned and spaced as above described are created by removing said surface contamination layer within said zones. On a fiber which in its primary original surface conditon by nature adheres well or too well to the matrix material, bad or non-adhering crack stopper zones dimensioned and spaced as above described are created by application of barrier substances within said zones. On a fiber which by nature in its original surface condition would be poorly or non-adhering to the matrix material, but is treated or contaminated with a primer surface layer of well-adhering substances, bad-adhering or non-adhering crack stopper zones dimensioned and spaced as above described are created either by application of suitable barrier substances or by removing said well-adhering primary face substances within said zones.

The just mentioned treating step comprise advancing an individual fiber or fiber bundle of fiber tape through a treatment station and treating the fiber surface for imparting a predetermined adhesiveness to the entire fiber surface, and then changing said predetermined adhesiveness in certain zones spaced from each other along the length of the fiber to provide alternating zones of different bonding ability along the length of the fiber relative to an embedding matrix material in which the fiber is to be embedded. The predetermined adhesiveness changed by applying to said primary surface in said spaced zones an adhesiveness determining substance which may be an adhesiveness improving or reducing substance, respective to the primary surface of the fiber, by means of a pair of tool members forming a gap between the tool members, rotating said pair of tool members in opposite directions, and passing said fiber or fibers through said gap for changing the predetermined adhesiveness in said zones along the length of the fiber.

The predetermined adhesiveness changed by applying to said primary surface in said spaced zones an adhesiveness determining substance which may be an adhesiveness improving or reducing substance by deposition through a filter mask while rotating said filter mask in the form of one or several endless belts in such a direction that the belts run adjacent to the fiber or fibers and move in the same direction as the advancing fiber or fibers. The endless belt filter masks arranged in opposing pairs so that the members of a pair form a gap through which the fiber or fibers are passing, and rotating said endless belt filter masks of a pair in opposite directions so that belt runs facing each other move in the same direction adjacent said gap and in synchronism with the fiber advance. The deposition take place out of a gas or vapor phase of said adhesiveness determining substance. The deposition take place, in another way, as a plasma deposition of said adhesiveness determining substance.

The adhesiveness along a fiber by coating in said treating step the entire surface of said fiber with an adhesiveness determining substance or using a natural or pretreated or contaminated fiber and then removing said adhesiveness determining substance at said certain zones spaced from each other along the length of said fiber for providing an increased bonding ability of the fiber surface at said certain zones where the adhesiveness determining substance has been removed.

The removing step is performed by a contact transfer of a reaction substance onto the fiber surface, whereby said reaction substance reacts with said adhesiveness determining substance for destroying the adhesiveness determining substance or for converting the adhesiveness determining substance into an adhesive layer. The removing step may be performed by the application of thermal energy to said adhesiveness determining substance. In another way the removing step may be performed by applying destructive radiation to said adhesiveness determining substance.

The changing of the adhesiveness may be changed by applying an adhesiveness reducing substance for reducing a bonding ability of a fiber surface relative to the embedding matrix material as compared to the bonding ability of the fiber surface uncoated by said adhesiveness reducing substance. Thus, the bonding ability may be reduced to zero or to substantially zero. The bonding ability may be changed in another way by applying first and second ring zones to the surface of a fiber, said ring zones alternating with each other along the length of a fiber, said first ring zones having a high bonding ability, said second ring zones having a lower bonding ability than said first ring zones or no bonding ability.

What is claimed is:

1. A fiber reinforced composite material, comprising fibers and a matrix material in which said fibers are embedded, each of said fibers having along its length first surface ring zones around the respective fiber with a first given adhesiveness or bonding ability and second surface ring zones around the respective fiber with a second adhesiveness or bonding ability lower than said given adhesiveness for providing different bonding abilities between the fiber surface and the embedding matrix material at said first and second surface ring zones along the length of said fibers, said second surface ring zones being interspersed between said first surface ring zones along the length of the respective fiber for providing a crack stop characteristic at an interface between the fibers and said embedding matrix material at said second surface ring zones.

2. A composite material, comprising fibers and a matrix material in which said fibers are embedded, each of said fibers having along its length first surface ring zones around the respective fiber with a first given adhesiveness or bonding ability and second surface ring zones around the respective fiber with a second adhesiveness or bonding ability higher than said given adhesiveness for providing different bonding abilities between the fiber surface and the embedding matrix material at said first and second ring zones along the length of said fibers, said second surface ring zones being interposed between said first surface ring zones along the length of the respective fiber for providing a crack stop characteristic at an interface between the fibers and said embedding matrix material at said first surface ring zones of lower adhesiveness.

3. The composite material of claim 1, wherein said second adhesiveness is substantially zero or zero.

4. The composite material of claim 2, wherein said first adhesiveness is substantially zero or zero.

5. The composite material of claim 1 or 2, wherein the zones of higher bonding ability have such an area which provides the transmittance of a shearing load substantially higher than the ultimate breaking strength of the respective fiber and which are spaced from each other along the length of the respective fiber in such a way to provide the said crack stop characteristic in the interspaced zones of lower or no bonding ability.

6. The composite material of claim 1 or 2, wherein a plurality of fibers forming a group are arranged in parallel to one another in said matrix material, said fibers being axially displaced relative to each other in the matrix material so that said surface zones of higher adhesiveness are staggered relative to each other in the matrix material surrounding said group fibers for fully utilizing the breaking strength of said fibers in reinforcing the composite material.

7. The composite material of claim 6, wherein said surface zones of higher adhesiveness of the fibers forming said group are arranged in a non-overlapping relationship relative to each other in the matrix material.

8. A fiber reinforced composite material, comprising fibers selected from a group consisting of boron fibers, carbon fibers, graphite fibers, and silicon carbide fibers, and a matrix material in which said fibers are embedded, said matrix material being selected from a group consisting of aluminum, resin, and borosilicate glass, each of said fibers having along its length first and second surface ring zones around the respective fiber, each surface ring zone having one of first and second different bonding abilities for providing higher and lower strength bonds between the fiber surface and the embedding matrix material, said surface ring zones of higher and lower strength bonds alternating with each other along the length of said fibers for providing a crack stop characteristic at an interface between the fibers and said embedding matrix material at surface ring zones having said lower strength bonds.

9. The fiber reinforced composite material of claim 8, wherein said lower strengths are zero or substantially zero.

10. The fiber composite material of claim 8, wherein said ring zones having said higher strength bonds have an area sufficient in size for transmitting a shearing load substantially higher than an ultimate breaking strength of the respective fiber, said surface ring zones having said higher strength bonds being spaced from each other by surface ring zones having lower or no strength bonds along the length of the respective fiber in such a way that said crack stop characteristic is provided in said surface ring zones of lower strength or no strength bonds.

11. The fiber composite material of claim 8, wherein a plurality of fibers forming a group are arranged in parallel to one another in said matrix material, said fibers being axially displaced relative to each other in the matrix material so that surface ring zones of higher strength bonds are staggered relative to each other in the matrix material surrounding said group of fibers for fully utilizing the breaking strength of said fibers in reinforcing the composite material.

12. The fiber composite material of claim 11, wherein said surface ring zones of higher strength bonds of the fibers forming said group are arranged in a non-overlapping relationship relative to each other in the matrix material.

13. A fiber reinforced composite material, comprising a matrix material of aluminum, and boron fibers embedded in said matrix material of aluminum, said boron fibers having first surface ring zones around the respective fiber, an adhesion reducing layer of aluminum oxide ($Al_2O_3$) on each of said first surface ring zones, and second surface ring zones around the respective fiber, said second ring zones being free of said adhesion reducing layers for spacing said first surface ring zones from each other by said second surface ring zones along said fibers, said adhesion reducing layers providing a low or no bonding strength between the fibers and the matrix material, said second surface ring zones having a higher bonding strength between the fibers and the matrix materials for providing a crack stop characteristic at said first surface ring zones of low or no bonding strength between the boron fibers and the matrix material of aluminum.

14. A fiber reinforced composite material, comprising a resinous matrix material, and carbon fibers embedded in said resinous matrix material, said carbon fibers having first surface ring zones around the respective fiber, adhesion reducing means on said first surface ring zones, and second surface ring zones around the respective fiber intermediate said first surface ring zones, said adhesion reducing means providing a low or no bonding strength between said carbon fibers and said resinous matrix material, said second surface ring zones having a further bonding strength between said carbon fibers and said resinous matrix material, said further bonding strength being higher than said low or no bonding strength, for providing a crack stop characteristic at said adhesion reducing means on said first surface ring zones.

15. The fiber reinforced composite material of claim 14, wherein said adhesion reducing means comprise a layer of silicon on said first surface ring zones of said carbon fibers.

16. The fiber reinforcing composite material of claim 14, wherein said adhesion reducing means comprise an adhesion reducing or adhesion inhibiting surface on said first surface ring zones of said carbon fibers.

17. A fiber reinforced composite material, comprising a borosilicate glass matrix material and silicon carbide fibers embedded in said borosilicate matrix material, said silicon carbide fibers having first surface ring zones around said silicon carbide fibers, adhesion reducing means on said first surface ring zones, and second surface ring zones around said silicon carbide fibers intermediate said first surface ring zones, said adhesion reducing means providing a low or no bonding strength between said silicon carbide fibers and said borosilicate glass matrix material, said second surface ring zones having a further bonding strength between said silicon carbide fibers and said borosilicate glass matrix material, said further bonding strength being higher than said low or no bonding strength for providing a crack stop characteristic at said adhesion reducing means on said first surface ring zones.

18. The fiber reinforced composite material of claim 17, wherein said adhesion reducing means comprise a layer of graphite on said first surface ring zones.

19. The fiber reinforced composite material of claim 17, wherein said adhesion reducing means comprise an adhesion reducing or adhesion inhibiting surface on said first surface ring zones of said silicon carbide fibers.

* * * * *